United States Patent
Zhu et al.

(10) Patent No.: US 9,760,301 B2
(45) Date of Patent: Sep. 12, 2017

(54) WOM CODE EMULATION OF EEPROM-TYPE DEVICES

(71) Applicant: Texas Instruments Incorporated, Dallas, TX (US)

(72) Inventors: Yuming Zhu, Plano, TX (US); Manish Goel, Plano, TX (US); Clive Bittlestone, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 93 days.

(21) Appl. No.: 14/826,183

(22) Filed: Aug. 13, 2015

(65) Prior Publication Data

US 2017/0046090 A1 Feb. 16, 2017

(51) Int. Cl.
| | | |
|---|---|---|
| G06F 12/00 | (2006.01) | |
| G11C 17/00 | (2006.01) | |
| G06F 3/06 | (2006.01) | |
| G11C 17/14 | (2006.01) | |
| G06F 9/445 | (2006.01) | |
| G06F 12/02 | (2006.01) | |
| G06F 17/30 | (2006.01) | |

(52) U.S. Cl.
CPC .......... *G06F 3/0634* (2013.01); *G06F 3/0614* (2013.01); *G06F 3/0616* (2013.01); *G06F 3/0685* (2013.01); *G06F 8/66* (2013.01); *G11C 17/146* (2013.01); *G06F 12/0246* (2013.01); *G06F 17/30188* (2013.01); *G06F 2206/1014* (2013.01)

(58) Field of Classification Search
None
See application file for complete search history.

(56) References Cited

U.S. PATENT DOCUMENTS

| | | | | |
|---|---|---|---|---|
| 6,895,490 | B1 * | 5/2005 | Moore | G06F 3/0607 365/230.03 |
| 7,062,602 | B1 * | 6/2006 | Moore | G06F 3/0607 365/185.29 |
| 7,398,348 | B2 * | 7/2008 | Moore | G06F 3/0607 365/218 |
| 2002/0136068 | A1 * | 9/2002 | Widdershoven | G11C 16/349 365/200 |
| 2004/0098397 | A1 * | 5/2004 | Suzuki | G06F 3/08 |

(Continued)

*Primary Examiner* — Kaushikkumar Patel
(74) *Attorney, Agent, or Firm* — John R. Pessetto; Charles A. Brill; Frank D. Cimino

(57) ABSTRACT

A system for write-once memory (WOM) code emulation of EEPROM-type devices includes, for example, a host processor for sending data words for storing in a WOM (Write-Only Memory) device. A host interface receives the data words for encoding by a WOM controller. An emulator programs the WOM-encoded data and an address identifier as an entry of the WOM device. The emulator overwrites previously programmed WOM-encoded data by searching entries of a current active page of a WOM device to locate a programmed WOM entry that includes the searched-for address identifier and the previously written WOM-encoded data word. When the previously written WOM-encoded word cannot be correctly overwritten, the contents of the second WOM-encoded word are stored in a new entry. When the current active page is substantially full, the new entry is stored a new page and the current active page is block-erased.

19 Claims, 5 Drawing Sheets

(56) References Cited

U.S. PATENT DOCUMENTS

| | | | |
|---|---|---|---|
| 2004/0141358 A1* | 7/2004 | Egner | G11C 17/005 365/145 |
| 2013/0080681 A1* | 3/2013 | Yaakobi | G06F 11/1048 711/102 |
| 2013/0297853 A1* | 11/2013 | Balakrishnan | G06F 12/0866 711/103 |
| 2015/0248325 A1* | 9/2015 | Calderbank | G06F 11/1048 714/768 |
| 2016/0224408 A1* | 8/2016 | En Gad | G06F 11/1008 |

* cited by examiner

WOM CODE EMULATION OF EEPROM-TYPE DEVICES

BACKGROUND

Computer systems include processors that are operable to retrieve, process, and store data in memory devices. The memory devices used in computer systems include different kinds of memory devices, where the differing types of memory devices typically have different capabilities and operating characteristics. The type of memory device used in a particular system is selected in accordance with the requirements of a particular application of the computer system. For example, some system designs require the ability to write and read data to and from non-volatile memory locations. However, some memory device solutions (such as electrically erasable read-only memories) are unsuited for some applications due to increased cost and decreased performance characteristics.

SUMMARY

The problems noted above can be addressed in a system for write-once memory (WOM) code emulation of EEPROM-type devices that includes, for example, a host processor for sending data words for storing in a WOM (Write-Only Memory) device. A host interface receives the data words for encoding by a WOM controller. An emulator programs the WOM-encoded data and an address identifier as an entry of the WOM device. The emulator overwrites previously programmed WOM-encoded data by searching entries of a current active page of a WOM device to locate a programmed WOM entry that includes the searched-for address identifier and the previously written WOM-encoded data word. When the previously written WOM-encoded word cannot be correctly overwritten, the contents of the second WOM-encoded word are stored in a new entry. When the current active page is substantially full, the new entry is stored a new page and the current active page is block-erased.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion.

Figure 1:
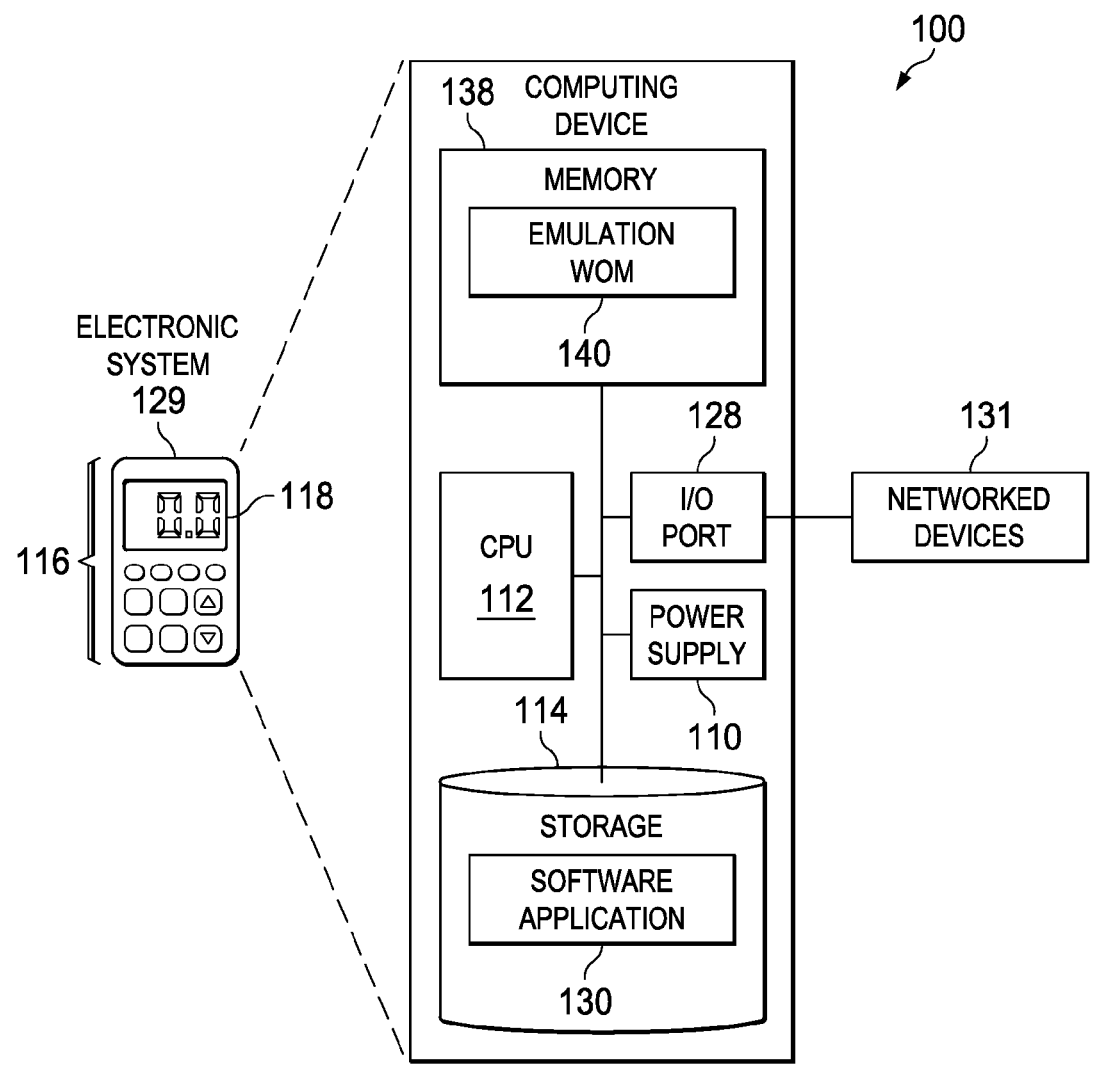
FIG. 1 shows an illustrative electronic device in accordance with example embodiments of the disclosure.

FIG. 1 shows an illustrative computing system 100 in accordance with certain embodiments of the disclosure. For example, the computing system 100 is, or is incorporated into, an electronic system 129, such as a computer, electronics control "box" or display, communications equipment (including transmitters), or any other type of electronic system arranged to generate radio-frequency signals.

In some embodiments, the computing system 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing system 100.

The CPU 112 comprises memory and logic that store information frequently accessed from the storage 114. The computing system 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like. The CPU 112 is coupled to I/O (Input-Output) port 128, which provides an interface that is configured to receive input from (and/or provide output to) networked devices 131. The networked devices 131 can include any device capable of point-to-point and/or networked communications with the computing system 100. The computing system 100 can also be coupled to peripherals and/or computing devices, including tangible, non-transitory media (such as flash memory)

and/or cabled or wireless media. These and other input and output devices are selectively coupled to the computing system 100 by external devices using wireless or cabled connections. The storage 114 can be accessed by, for example, by the networked devices 131.

The CPU 112 is coupled to I/O (Input-Output) port 128, which provides an interface that is configured to receive input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing system 100 by external devices using or cabled connections. The CPU 112, storage 114, and power supply 110 can be coupled to an external power supply (not shown) or coupled to a local power source (such as a battery, solar cell, alternator, inductive field, fuel cell, capacitor, and the like).

The computing system 100 includes a memory 138. The memory 138 is suitable for relatively quick memory accesses and is typically formed using solid state memory devices. Such solid-state memory devices include the emulation WOM (write-once memory) 140. The emulation WOM 140 is memory (such as "flash" memory) that is typically written once (or a relatively small number of times) before (for example) being abandoned or erased.

The emulation WOM 140 write accesses are typically faster than emulation WOM 140 erase cycles (if any). In an embodiment, the write accesses are capable of changing a bit location in the emulation WOM 140 from an erased state to a written state (such as a "0" to a "1"). The erased state typically depends on a technology selected, and accordingly can be erased to either a "0" to a "1," where the written state is typically the opposite of the written state. (Some memory devices may store multiple bits of information in a single memory cell in which case the written bits include one of more bits of information that have a state opposite the erased state.)

WOM codes are used to efficiently write to the emulation WOM 140 such that the written-to WOM can be written to multiple times without erasure. The emulation WOM 140 can be used to provide cost-efficient non-volatile memory (NVM) having a limited reprogramming capability and/or an enhanced number of write/erase cycles (e.g., as compared with often more costly EEPROM NVM solutions).

Figure 2:
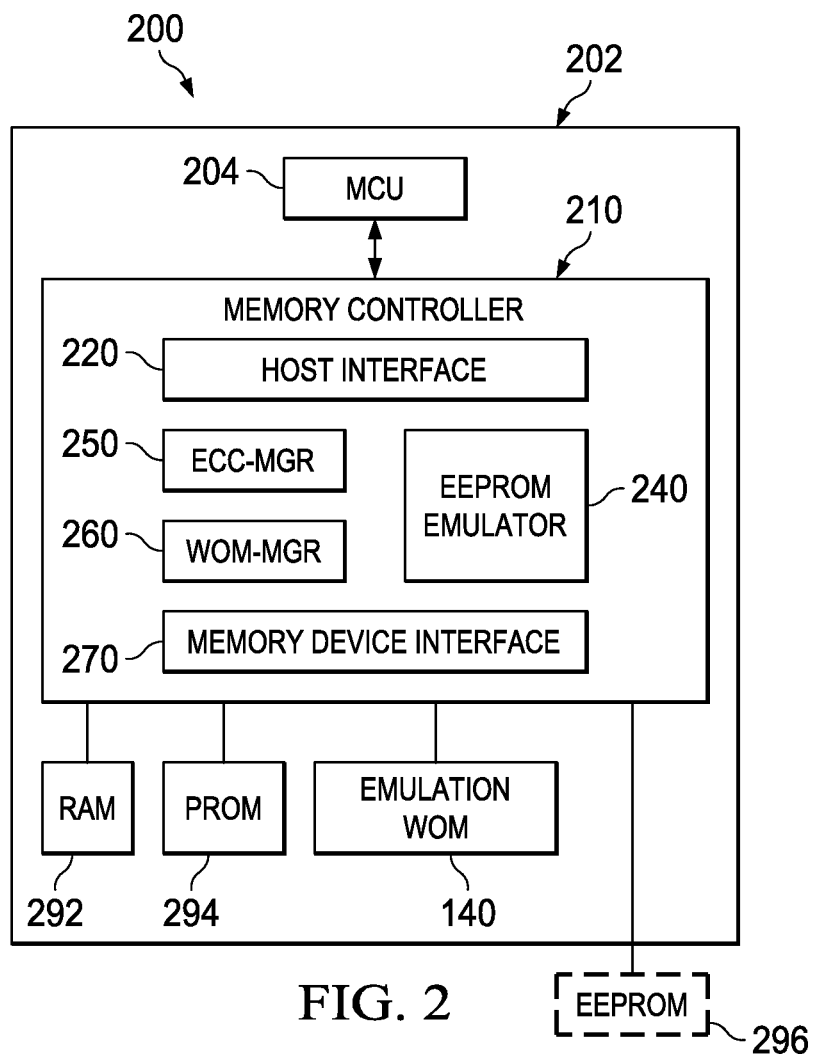
FIG. 2 is a block diagram of an EEPROM emulation system in accordance with embodiments of the disclosure.

FIG. 2 is a block diagram of an EEPROM emulation system in accordance with embodiments of the disclosure. Generally described, an EEPROM emulation system 200 is operable to emulate EEPROM functionality using WOM technology (e.g., to avoid costs associated with using EEPROM technology). The EEPROM emulation system 200 includes an MCU 204 and a memory system 210. The MCU 204 and the memory system 210 are typically arranged on a common substrate 202. The memory system 210 is operable to manage memory accesses to memory devices to (at least) the emulation WOM 140 as well as memory devices such as (e.g., volatile) RAM 292, (e.g., non-volatile) PROM (programmable read-only memory) 294, and EEPROM (electrically erasable read-only memory) 296 (which is optionally formed using a substrate that is different from the substrate 202). The term "EEPROM" is generally used herein to refer to a "non-flash" EEPROM device that is typically capable of being erased in smaller block sizes (such as at a byte level) than the larger erasable-block sizes of flash memory.

The EEPROM 296 is a non-volatile memory that is used by an application to (e.g., securely) store (e.g., relatively small amounts of) system related data. The EEPROM 296 is typically not included on the same silicon substrate as the MCU 204 executing the application due to various reasons such as cost, availability for target process (e.g., processes for manufacturing EEPROM often require more and different steps than cheaper alternatives), and the like. However, using such an off-chip EEPROM often increases the layout area of the system for executing the application and often increases the overall cost of the system.

In contrast, many MCUs include on-chip (e.g., on the same silicon substrate) flash memory for code and data storage purposes. To reduce costs (e.g., of external or internal components), flash-type memory is operable to emulate the operations of EEPROM. However, flash memory and EEPROM have substantial differences in how data is stored in the respective devices.

For example, EEPROM-type memories support read, write and update operation for storing variable data (e.g., data that is changeable and/or subject to change) at a relatively high level of granularity (e.g., addressable at a byte or word level). In contrast, flash-type memories allow individual bits to be written (e.g., from "1" to "0") but not to be easily updated (e.g., from "0" to "1"). To change value of a bit from "0" to "1," a block-erase operation is normally required to restore all bits in the same erasure block to "1." Each such block contains several hundreds or thousands of bytes that are otherwise (e.g., during write operations) individually addressed depending on a selected system configuration.

Also for example, for devices manufactured using extant processes, the flash-type memories typically have lower write endurances (e.g., having a maximum of around 10K erasure cycles) as compared with the EEPROM specifications (e.g., having a maximum of around 100K read/write cycles). Accordingly, the memory system 210 is operable to maintain multiple images (e.g., 10 or more copies of memory data, which is an integer ratio of the respective write-endurance maximums) of a memory space and to perform the wear-leveling techniques to achieve a targeted write-endurance level. Accordingly, the example memory system 210 has an emulation density than can be determined in response to the number of images of memory that it capable of holding in total.

As disclosed herein, the memory system 210 is operable to efficiently emulate EEPROM-type memory using write-once-memory (WOM) encoded flash-type memories. The flash-type memories (such emulation WOM 140) are encoded with a WOM code, such as proposed by Rivest and Shamir (1982). The memory system 210 is operable to increase maximum emulation densities (e.g., cost per bit) while maintaining the write-endurance capabilities (e.g., the life cycle of a device as determined by the number of erase and/or write cycles).

In operation, memory accesses serviced by the memory controller 210 include write operations and read operations. In general, the data conveyed in write operations is transmitted in a top-to-bottom direction as illustrated in FIG. 2, while the data of read operations is transmitted in a bottom-to-top direction as illustrated in FIG. 2. Accordingly, the host interface 220 is arranged to select (e.g., in response to a system address supplied with a memory access command) a memory device of which data is written to or read from.

The memory controller 210 is operable, for example, to perform memory operations for coding and decoding both ECC (if present) and WOM codes. The written-once memory (WOM) code allows the memory cells (e.g., "bits") of a memory location in the WOM to be written multiple times without erasure, which increases an otherwise limited device programmability and/or enhances the write/erase endurance of the emulation WOM 140. In one embodiment, the memory controller 210 supports both (e.g., Hamming-type) ECC and WOM codec functionality through the sharing of components between the ECC manager 250 (if present) and the WOM manager 260.

The memory controller 210 optionally includes an ECC controller such as ECC manager 250. During write operations, the ECC manager 250 is operable to apply an error correction code to data for writing to the emulation WOM 140. During read operations, the ECC-manager 250 is operable to evaluate the retrieved data and, if indicated, the ECC controller is operable to execute a corrective action in response to the evaluation (e.g., to correct the retrieved data using ECC-encoded data read from the emulation WOM 140 via the WOM manager 260).

The memory controller 210 includes the WOM manager 260. During write operations, the WOM manager 260 is operable to encode data (e.g., data encoded by the ECC-manager 250 using an ECC encoding when the ECC manager 250 is present) using a WOM code for writing the WOM (and ECC) encoded data to the emulation WOM 140. During read operations, the WOM manager 260 is operable to decode the WOM-encoded data from the emulation WOM 140. After the WOM-encoded data is decoded, the decoded data is optionally transmitted to the ECC-manager 250 to be further decoded in accordance with any ECC-encoding used to originally encode the data written to the emulation WOM 140.

The memory controller 210 includes the memory device interface 270. During write operations, the memory device interface 270 is operable to write the encoded data to the emulation WOM 140 (e.g., the encoded data is stored as an entry in a memory location of the WOM 140). During read operations, the memory device interface 270 is operable to read the encoded data from the emulation WOM 140. In an embodiment, a second layer of addressing is performed by storing an address identifier in association with the stored encoded data such that the stored encoded data is located by searching (e.g., serially) the address identifier of each stored entry for a particular address identifier.

The memory device interface 270 is also operable to perform block initialization routines on the emulation WOM 140 (e.g., to block erase the emulation WOM 140 such that all bits of all addressed memory locations in the block being erased are all erased/cleared to a logic-one state.) Typically, the block initialization routines require substantially more time to execute than each read or write cycle of the emulation WOM 140.

The memory controller 210 includes the EEPROM emulator 240. The EEPROM emulator 240 is operable to perform memory-access operations such as writing and reading WOM-encoded data to and from the emulation WOM 140. The EEPROM emulator 240 is operable to perform such memory-access operations using WOM encoding.

WOM encoding can be accomplished using n-bit symbols that are written to WOM memory a limited number of times. For example, TABLE 1 illustrates WOM encoding for 2-bit symbols that can be written to WOM twice (e.g., before memory erasure is required).

TABLE 1

| 2-bit Symbol | 3-bit WOM Code (1st writing) | 3-bit WOM Code (2nd writing) |
|---|---|---|
| 00 | 111 | 000 |
| 01 | 011 | 100 |
| 10 | 101 | 010 |
| 11 | 110 | 001 |

The coding scheme shown in TABLE 1 is a special case for a class of WOM code. It encodes (e.g., to-be-saved) 2-bit data (where d=[d(1), d(0)]) into a (e.g., to-be-written) 3-bit WOM code (where c=[c(2), c(1), c(0)]), where each 3-bit WOM code can be written 2 times. In contrast with the EEPROM memory cells (which assume a block-initialization state of logic-zero), flash memories are typically block initialized to a logic state of logic-one (e.g., where all bits are restored to "1"s after each erasure). Accordingly, the order of first and second encoding operations in the flash memory scheme is reversed (e.g., as compared with other WOM schemes in which all bits are erased to "0"s after each erasure) such that "1"s are selectively replaced with "0"s as a "one-way" function.

Each row of TABLE 1 illustrates that a 2-bit symbol is WOM-encoded into a 3-bit field. When the WOM-encoded data is written to WOM memory a first time, only one bit (at most) is cleared in the encoded data. When the WOM-encoded data is written to WOM memory a second time, at least two (of the three) bits are cleared in the encoded data. Accordingly, the WOM manager 260 is able to determine (e.g., using logic) the number of writes to a WOM location (for storing a WOM-encoded symbol). As described below, the WOM manager 260 is able to determine the number of writes to the WOM location by reading the data stored in the location (and without, for example, having to rely upon a separate counter for each memory location).

For the first write when the data to be saved is "00" (and the corresponding data to be written is "111"), no change is required. (The write operation is optionally skipped because a write of "111" does not change the stored value of "111.") When writing to a WOM location where it is uncertain whether the particular location of an entry has been written to with a bit set to zero, a read operation normally precedes the write operation (if necessary) to determine how many times the particular location of an entry has been written. Reduction in the rate of the number of times of write operations are actually (e.g., completely) performed results in increased device life and/or capacity.

For the first write when the data to be saved is other than "00" (and the corresponding data to be written is includes at least one "0"), then a value from the "first program" column of TABLE 1 (which corresponds to the data to be saved) is written to the WOM location. For example, when the to-be-saved data is "01," the to-be-written data value of "110" is written.

For the first-write operation, the to-be-written data values (c) are determined in response to the to-be-saved data values (d) in accordance with Equations (1), (2), and (3):

$$c_1(2) = \overline{d_1(1) \cdot d_1(0)} \tag{1}$$

$$c_1(1) = \overline{d_1(1) \cdot \overline{d_1(0)}} \tag{2}$$

$$c_1(0) = \overline{\overline{d_1(1)} \cdot d_1(0)} \tag{3}$$

For the second (e.g., having at least one bit value of "0") write to a WOM location, no change (e.g., no write operation) is required when the previous (e.g., stored) value is the same as the to-be-written value (where the to-be-written value is determined in accordance with the "second program" column of TABLE 1). For example, the to-be-written value "010" is determined when the to-be-saved data is "10."

For the second-write operation, the to-be-written data values (c) are determined in response to the to-be-saved data values (d) in response to Equations (4), (5), (6) and (7):

$$Chng=(d_2(1) \oplus d_1(1))+(d_2(0) \oplus d_1(0)) \quad (4)$$

$$c_2(2)=d_2(1) \cdot d_2(0)+\overline{c_1(2)}+\overline{Chng} \quad (5)$$

$$c_2(1)=d_2(1) \cdot \overline{d_2(0)}+\overline{c_1(2)}+\overline{Chng} \quad (6)$$

$$c_2(0)=\overline{d_2(1)} \cdot d_2(0)+\overline{c_1(2)}+\overline{Chng} \quad (7)$$

where the previously to-be-saved data $d_1$ is determined by decoding the retrieved code word $c_1$ (e.g., in accordance with TABLE 1), and Chng is the result of the determination of whether $d_2$ is different from $d_1$. The logic used to implement the WOM manager 260 can be simplified in accordance with the principle that a bit-level write of a "1" to a bit already written as a "0" cannot change the bit back to a "1" (e.g., "masking") as discussed in the following example.

In an example of a second write operation, a first-written code word (e.g., as read from the addressed WOM 140 location) is "110" and the to-be-written code word is "010" (e.g., for the second write operation). A code word of "011" is written instead because the LSB (e.g., least significant bit) of the to-be-written code word "011" is masked out in the writing and the LSB of the first-written code word is not changed. However, the MSB (most significant bit) of the first-written code word is changed because of the transition from a "1" to a "0."

In another example of a second write operation, the value of the second to-be-saved data $d_2$ is equal to the first to-be-saved (and subsequently saved) data $d_1$. When $d_2$ is the same as $d_1$, the code word "111" is written to the addressed WOM 140 location, which masks out all three bits of the to-be-written code word such that no change to the first-written code word is made. The second write logic of the EPROM emulator 240 is typically implemented in accordance with the Equations (4), (5), (6) and (7).

The decoding of the (e.g., retrieved-from-memory) WOM code includes XOR-based operations performed in accordance with Equations (8) and (9). For x=1 (first write operation) and x=2 (second write operation):

$$d_x(1)=c_x(2) \oplus c_x(1) \quad (8)$$

$$d_x(0)=c_x(2) \oplus c_x(0) \quad (9)$$

Whether an individually addressed WOM location has been programmed (e.g., written to) one time or two times is determinable from evaluation of the code word stored in the each WOM location. As illustrated in TABLE 1 for example, a first-written code word (e.g., of three bits) includes at least two logic '1's in the code word, whereas a second-written code word includes at most a single logic '1' in the code word. Accordingly, whether an individually addressed WOM location has been written to one time or two times is determined in response to Equation 10:

$$P=[c_x(0) \cdot c_x(1)]+[c_x(0) \cdot c_x(2)]+[c_x(1) \cdot c_x(2)] \quad (10)$$

where P=1 for the first programming of the code word and P=0 for second programming of the code word. For example, P=1 indicates the stored contents in an individually addressed WOM location are operable to be overwritten and P=0 indicates the stored contents are not operable to be overwritten.

In an embodiment, the EEPROM emulation system stores an image of the emulated data in volatile memory (such as RAM, register files, and the like) in a non-encoded (e.g., not WOM-encoded) state to minimize the access time to the stored data. Data from the (e.g., non-encoded) memory image can be WOM-encoded and stored in WOM memory used to emulate EEPROM storage. The memory image can be stored in WOM memory in response to, for example, an indication for saving memory in non-volatile memory. The indication for saving memory in non-volatile memory is provided in response to a command (such as a shut-down command, sleep command, enter-low-power-mode command, and the like) and/or a state of a system parameter (e.g, a particular power mode, low-battery-status, expiration of a memory back-up timer, and the like).

Figure 3:
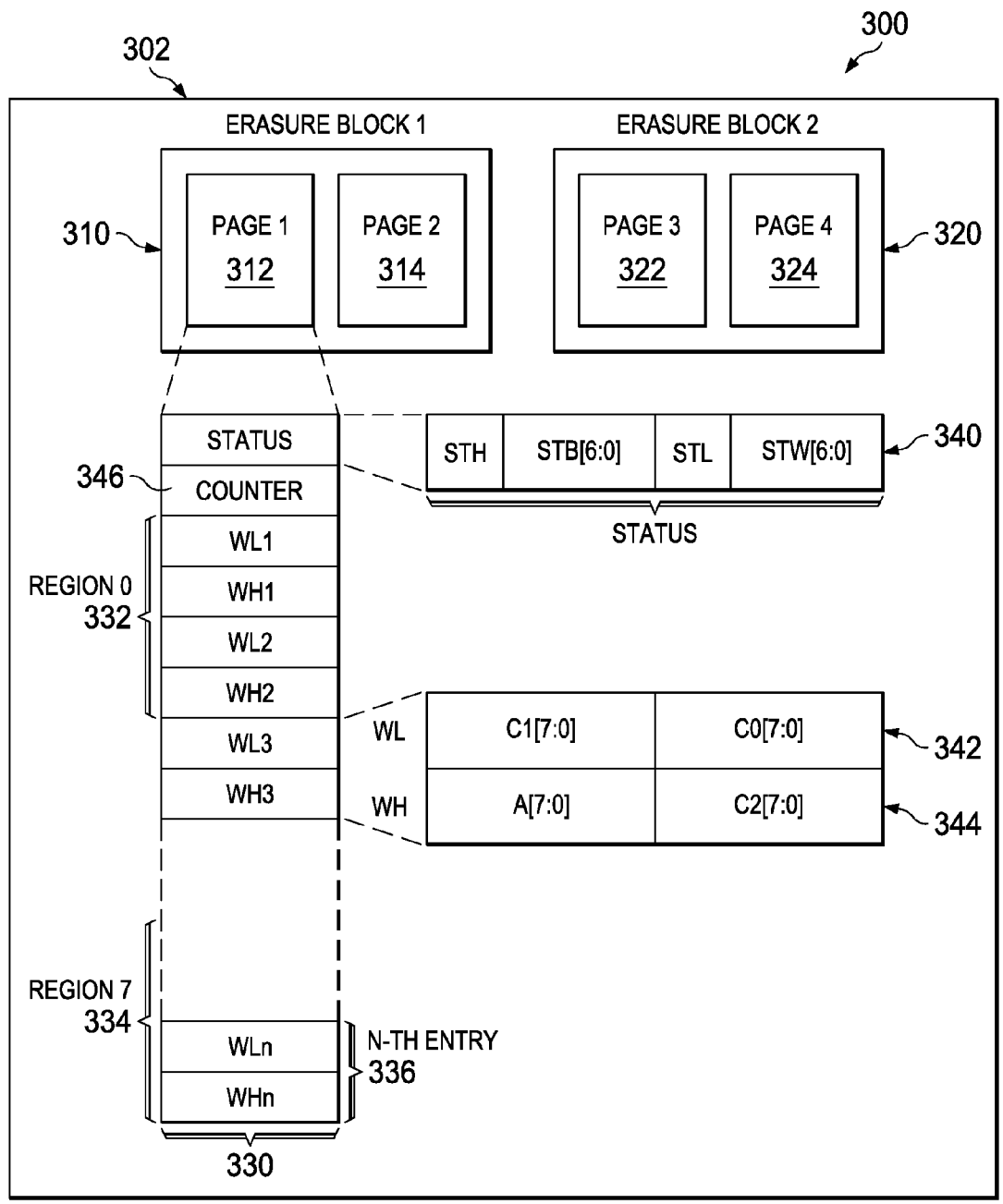
FIG. 3 is an architecture diagram of a WOM device for EEPROM emulation in accordance with embodiments of the present disclosure.

FIG. 3 is an architecture diagram of a WOM device for EEPROM emulation in accordance with embodiments of the present disclosure. Generally described, emulation WOM device 300 includes an EEPROM emulation WOM substrate 302 upon which arrays of selectively addressable memory cells (e.g., not shown for clarity) are formed. The EEPROM emulation WOM substrate 302 is operable for EEPROM emulation. Various memory organization variables are used to support the EEPROM emulation and are stored within 16-bit words either on the EEPROM emulation WOM substrate 302 or in memory in a separate substrate.

The selectively addressable memory cells are grouped between two or more erasure blocks (e.g., erasure blocks 310 and 320). The selectively addressable memory cells of the erasure blocks 310 and 320 are operable to be written to using memory accesses where each memory access has a duration substantially less than the duration of a block-erase operation (e.g., in which each of the selectively addressable memory cells are "erased" (e.g., set) to a logic "1" state).

The EEPROM emulation WOM substrate 302 is divided into a number of P pages, where each page is a basic frame structure for selectively addressing a word (e.g., where the word includes 16 bits) from memory cells that are selected using a common address. The size of a page can be equal or smaller than the block erasure size, where the design selection of the page size is a system design parameter that is made in accordance with a trade-off between access latency and the page copy frequency.

Each of the erasure blocks 310 and 320 include two or more pages of the individually addressable memory cells where, for example, erasure block 310 includes pages 312 and 314 while erasure block 320 includes pages 322 and 324. Accordingly, the EEPROM emulator 240 (and/or the WOM manager 260) is operable to selectively erase memory blocks (which, for example, allows a portion of the WOM to remain functional while another portion is being erased) and to selectively activate and deactivate (e.g., select and deselect) pages.

Each page optionally includes a plurality of regions. For example, the plurality of regions includes region 0 (332) through region 7 (334). The number of regions is normally selected to be a power of 2, for example, for efficiency of addressing a region and storing information related to an addressing a region. The speeds of searches for next available entries and stored (e.g., programmed) entries are enhanced, for example, by starting such searches in the current region. The current region is quickly located by accessing a status word for the page (described below) and generating a search-start address in response to the accessed status word.

In an embodiment, each region includes a plurality of entries, where each entry is a double word. Each double word includes a low word (WL 342) and a high word (WH 344). The low word WL 324 includes 16 memory cells for storing the lower two bytes (C1[7:0] and C0[7:0]) of a WOM-encoded word. The high word WH 344 includes 16 memory cells (e.g., bit locations) for storing the highest byte (C2[7:0]) of the WOM-encoded word and an 8-bit identifier (A[7:0]) used to identify (e.g., for selectively addressing) the stored contents of a particular WOM-encoded word.

In the embodiment, the 8-bit address identifier is for uniquely identifying as many as 256 entries. An entry is located (e.g., addressed), for example, by searching for an entry having an address identifier that corresponds (e.g., matches) with a portion of an index (e.g., address) used to originally store the entry (e.g., where the entries are not necessarily stored in a numerical order of the address identifiers). The disclosed embodiment efficiently stores the 3-byte WOM-encoded data (derived from 2 bytes) and the address identifier (1 byte long) into a double word (4 bytes long), which, for example, increases emulation densities and promotes speeds of access.

Each page includes a status word 340, a counter 346, and a plurality of regions such as region 0 (332) through region 7 (334). In an embodiment, the status word 340 is 16 bits and includes an STH (status high) field, an STB (bank status) field, an STL (status low) field, and an STW (write status of a region) field. The STL field is used in conjunction with the STH field to determine a status for a page as described in TABLE 2 listed below:

TABLE 2

| STH | STL | Page Status |
|---|---|---|
| 1 | 1 | Ready to Use |
| 0 | 1 | In Use |
| 0 | 0 | Used (Ready to Erase) |
| 1 | 0 | Invalid State |

The STH field is written to a "0" when the page is activated (in contrast with the default, block-erased state of "1"), while the STL field is written to a "0" when the last available location is written.

The STB field is used to identify the banking of the content in the current page. Banks are used, for example, when more than the 8-bits of the unique identifier are used to separately address memory. For example, the STB field indicates when the total amount of values exceeds the amount of values that can be stored with unique ID within the page. When a number "M" (e.g., 8 bits) of emulated values is stored in each page, an index having a maximum value X (e.g., 12 bits) is used to uniquely address an entry. The entry is uniquely identified by a number M bits uniquely that uniquely identify an entry within a bank, and a number X/M bits (e.g., 4 bits) uniquely identifies the page (e.g., sub-bank) in which the addressed entry resides. For simplicity, M is typically chosen to be power of 2.

The STW field indicates which region includes the last written location within the page. In an embodiment, the STW has 7 bits and the page area is divided into 8 regions. For the first 7 regions, the corresponding bit in STW is written to a "0" when all (e.g., usable) memory locations in the respective region cannot be written to (e.g., by using a valid first or second write). When all memory locations of every region have been written to (e.g., where the n-th entry 336 has been written), all of the STW bits are set to "0." (Eight STW bits are not necessary for tracking 8 regions, for example, because it is "known" that one only more region remains after the next-to-last region is no longer functional without erasure.)

Counter 346 is an erasure counter that is operable to maintain a running total (e.g., count) of the number of times the associated page has been block erased (e.g., where all bits are set to "1" in a block memory operation). More than one word (e.g., 16 bits) can be used to maintain the count (e.g., in accordance with the endurance level of the particular flash memory that is used. The value of the counter 346 can be maintained in a location separate from the page being block erased (such as when the page is being erased, or other times as well). The use of one counter per page, for example, minimizes the amount of memory that would otherwise be required for maintaining counts for particular regions and/or entries.

As described above, region 0 (332) through region 7 (334) are operable to store WOM-encoded data. For example, a double word (WH 344 and WL 342) to store 1 word of data 2 times. A first byte of the WH 344 is operable to represent the value of the address identifier (A[7:0]) while a second byte of the WH 344 and both bytes of WL 342 are operable to represent C2, C1 and C0 of the WOM-encoded data (e.g., "code word"). The code word is addressed using a (e.g., unique) index where a portion (e.g., the entire portion or less than the entire portion) of the index is stored as the address identifier (A[7:0]). For example, C2[0], C1[0] and C0[0] represent the 3-byte WOM-encoded word that is encoded in accordance with a 2-byte word containing data to be saved as described in above with reference to TABLE 1.

The width of the address identifier (A[7:0]) indicates the number of emulated values storable in a region of the associated page. When an 8-bit address identifier is used, up to 255 values are storable in the associated page (the "corner-case" value of all bits being "1" is typically not used because of the state of all bits being "1"s is the erased state, which might not reflect a current status). When the total number of values that are emulated is larger than can be addressed by the address identifier (e.g., stored in an entry of a page), additional pages are allocated (e.g., using banks) for the emulated values for use in emulation. The corresponding bank is identifiable by matching the STB field of the status word with a portion of the index used (e.g., originally) to form the address identifier of a particular stored code word.

Table 3 is a listing in pseudo-code assembly language describing a first encoding operation for a first write to a WOM location, a second encoding operation for a second write to the WOM location, and a decoding operation in accordance with 16-bit wide data operands. The operator "&" is the logical AND operation, the operator "|" is the logical OR operation, operator "~" is the logical NOT operation, operator "^" is the logical XOR operation, operator "<<" is the shift left operation, operator ">>" is the shift right operation, operator "=" is the assignment operation, operator "!=" is the conditional is-NOT-equal-to operation, and operator " " indicates the value of the updated register.

TABLE 3

| 1st Encoding: | 2nd Encoding: | Decoding: |
|---|---|---|
| R0 = (D&0x00FF)<br>R1 = (D&0xFF00)>>8<br>WL = ~((R1 & ~R0)<<8) \| ~(~R1 & R0)<br>WH= (AD<<8) \| ~(R1 & R0) | AD = WH>>8<br>R0 = (WH&0x00FF)<<8 \| (WH&0x00FF)<br>OldD = WL ^ R0<br>Chng = OldD ^ D<br>If Chng != 0<br>  R0 = WL&0x00FF<br>  R1 = (WL&0xFF00)>>8<br>  R2 = WH&0x00FF<br>  D0 = D&0x00FF<br>  D1 = (D&0xFF00)>>8<br>  R0' = (~D1&D0) \| ~R0<br>  R1' = (D1&~D0) \| ~R1<br>  R2' = (D1&D0) \| ~R2<br>  WL' = (R1' <<8) \| R0'<br>  WH'= (AD<<8) \| R2'<br>endif | AD = WH>>8<br>R0 = (WH&0x00FF)<<8 \| (WH&0x00FF))<br>D = WL ^ R0 |

Table 4 is a listing in pseudo-code assembly language in accordance with 16-bit wide data operands for determining whether a WOM location can be written to. The operator "==" is the conditional is-equal-to operation.

TABLE 4

| Writable Location Determination: |
|---|
| R1 = WL<br>R2 = (WL<<8) \| (WL>>8)<br>R2 = (WH<<8) \| (WH&0x00FF)<br>R0 = (R1 & R2) \| (R1 & R3) \| R2 & R3)<br>isWriteableLocation = (R0==0xFFFF) |

Figure 4:
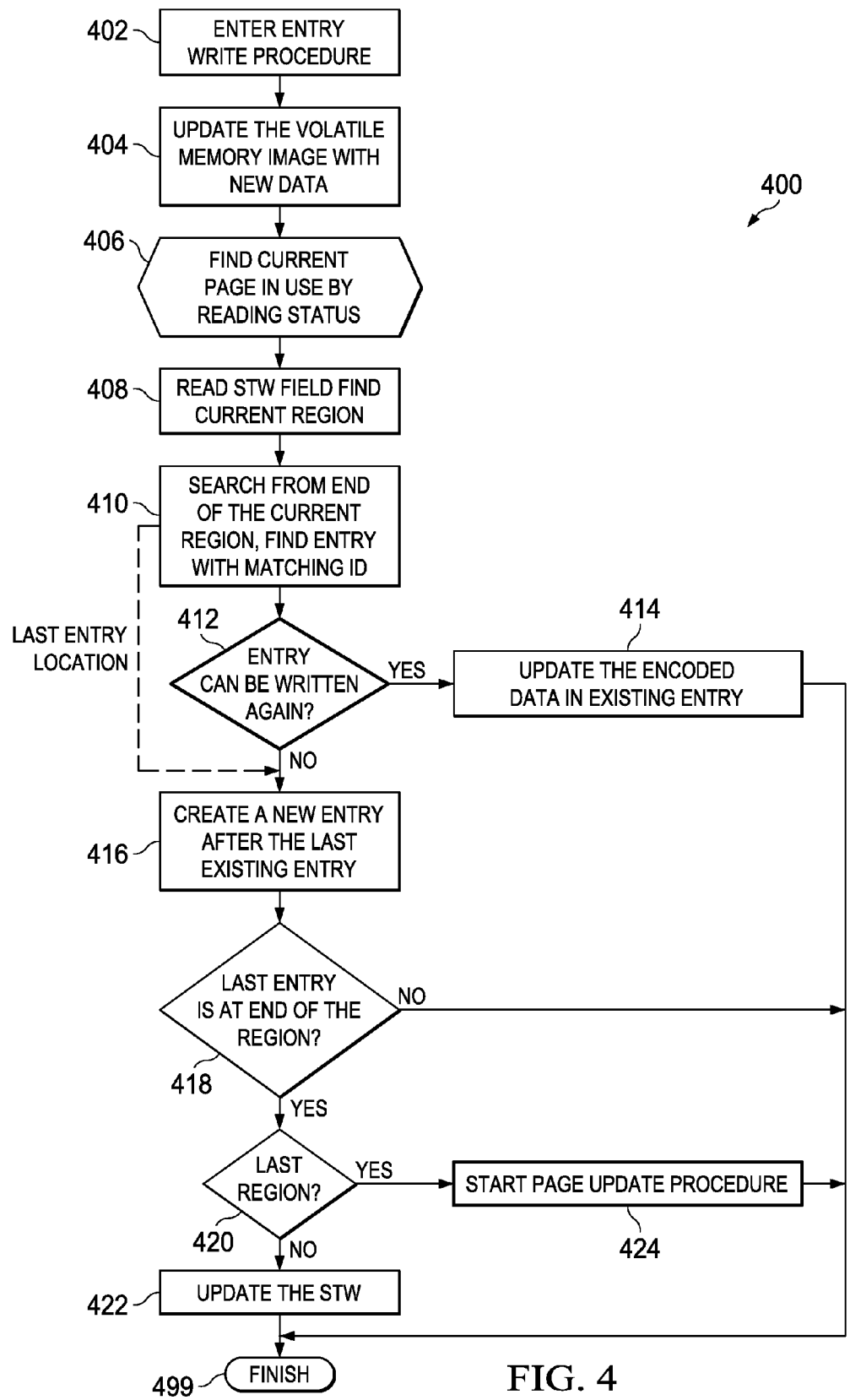
FIG. 4 is a flow diagram of an entry write procedure in accordance with embodiments of the present disclosure.

FIG. 4 is a flow diagram of an entry write procedure in accordance with embodiments of the present disclosure. Process flow begins in terminal 402 where process flow proceeds to operation 404. In operation 404, the volatile memory image is updated with new data (e.g., to be written in the WOM). For example, the volatile memory is used to store an image of data (e.g., that is not WOM-encoded) for quick memory accesses by the instant process (e.g., as well as other processes). Process flow proceeds to operation 406.

In operation 406, a status word is read to determine whether the page (e.g., associated with the status word) is the current (e.g., currently active) page. For example, the status word for each page in a currently used erasable-block is polled to determine if a page is a currently active page (e.g., current page). Process flow proceeds to operation 408.

In operation 408, the STW field of the status word of the active page is ready to determine the current region of the page. For example, the current region can be used to quickly locate a next available entry location in which the data to be written is to be WOM-encoded and stored. Process flow proceeds to operation 410.

In operation 410, a search is performed from the end of the current region to find an entry having an identifier that is associated with the data to be written. For example, the address identifier (A[7:0]) of each entry in the current region is compared with the identifier associated with (e.g., the identifier used to store) the entry data to determine which entry, if any, has a matching address identifier. If no such identifier is found at the time the last entry location is searched, process flow proceeds to operation 416. Otherwise, process flow proceeds to operation 412.

In operation 412, the contents of the identified entry are examined to determine whether the memory cells of the identified entry can be correctly overwritten in accordance with the WOM encoding. For example, the (WOM-encoded, functional) contents of the identified entry are evaluated (e.g., in accordance with the logic equations described above) to determine whether the contents were written using a first WOM write operation or a second WOM write operation. When it is determined that the contents of the identified entry can be overwritten correctly (e.g., the entry was not written to by using a second WOM write), process flow proceeds to operation 414 (described below) where the encoded data in the existing entry is updated. When it is determined that the identified entry cannot be written to again, the identified entry is written to (e.g., marked) as no longer being writable and process flow proceeds to operation 416 (described below) where a new entry is created after the last existing entry.

In operation 414, the WOM-encoded data in the existing entry is updated. For example, the WOM-encoded data in the existing entry is updated by WOM-encoding the data to be stored and writing the WOM-encoded data to the WOM location of the existing entry. Process flow proceeds to terminal 499, where the current process flow finishes (and, for example, other processing is initiated or resumed).

In operation 416, a new entry is created after the last existing entry. For example, the new entry is created by allocating a word (e.g., double word) for storing an entry, WOM-encoding the data to be stored, and writing the WOM-encoded data and the address identifier to the allocated WOM location of the newest last entry. Process flow proceeds to operation 418.

In operation 418, the location of the newest last entry is evaluated to determine whether the newest last entry is a location at the end of the current region. When the newest last entry is not a location at the end of the current region, process flow proceeds to terminal 499, where the current process flow finishes (and, for example, other processing is initiated or resumed). When the newest last entry is a location at the end of the current region, process flow proceeds to operation 420.

In operation 420, the location of the current region is evaluated to determine whether the current region is the last region in the current page. When the current region is the last region in the current page, process flow proceeds to operation 424, which is a page update process described below with reference to FIG. 5. In various embodiments, new pages and new regions are allocated for storage when the current page and/or the current region is substantially full. A condition of being substantially full is when, for example, less than half of the remaining entry locations are unused or available state (e.g., being in a block-initialized state and/or being capable of being overwritten such that the overwritten memory accurately stores the data meant to be stored). When the current region is not the last region in the current page, process flow proceeds to operation 422.

In operation 422, the status word of the current page is updated. For example, a new region is allocated by updating the status word of the current page to point to a new region in the current page in which to store new entries. The current region can be used, for example, to help determine a starting point from which to search for specific existing entries. Process flow proceeds to terminal 499, where the current process flow finishes (and, for example, other processing is initiated or resumed).

Figure 5:
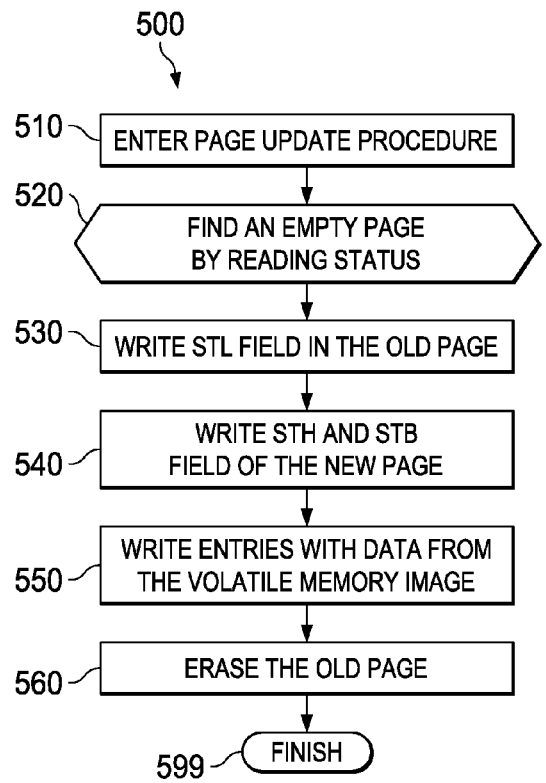
FIG. 5 is a flow diagram of an entry write procedure in accordance with embodiments of the present disclosure.

FIG. 5 is a flow diagram of an entry write procedure in accordance with embodiments of the present disclosure. Process flow begins in terminal 510 where the page update procedure is entered and from which the process flow proceeds to operation 520. In operation 520, the status word of each page (e.g., in a current erasable-block) is read to determine an empty (e.g., having a block-erased state) page that is suitable for writing to as a new current page. Process flow proceeds to operation 530.

In operation 530, the STL field in the old current page is written to. For example, the STL field in the old current page is written with a "0" to indicate the old current page is no longer valid and/or usable for storing new entries. Program flow stretch that process flow proceeds to operation 540.

In operation 540, the STH and STB fields of the new current page are written to. For example, the STH field is written with a "0" to indicate the new current page is valid and is usable for storing new entries, while the STB field is written with a "0" to indicate the new current region that is available for writing new entries. Process flow proceeds to operation 550.

In operation 550, entries of the new current page are written to. For example, the data stored in the volatile memory image is read, WOM-encoded, and stored as entries in (e.g., a first region of) the new current page wherein each entry has an address identifier that is stored in association with the entry. (In various embodiments, valid data from the old current page can be copied in a similar manner to the new current page.) Process flow proceeds to operation 560.

In operation 560, the old current page is erased. For example, when all of the formerly written to pages in an erasure block are no longer usable, all of the formerly written-to pages in the erasure block are block-erased. Process flow proceeds to terminal 599, where the current process flow finishes (and, for example, other processing is initiated or resumed).

Figure 6:
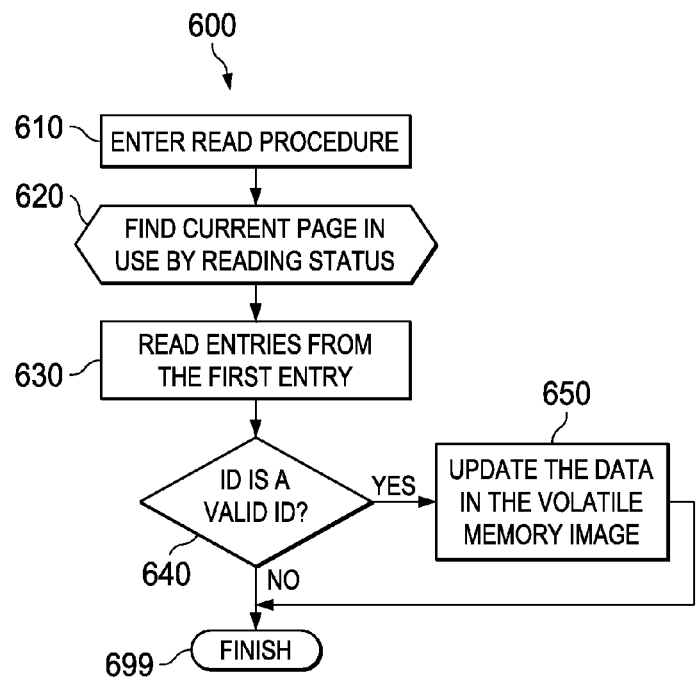
FIG. 6 is a flow diagram of an entry read procedure in accordance with embodiments of the present disclosure.

FIG. 6 is a flow diagram of an entry read procedure in accordance with embodiments of the present disclosure. Process flow begins in terminal 610 where the page update procedure is entered and from which the process flow proceeds to operation 620. In operation 620, the status word of each page (e.g., in a current erasable-block) is read to determine the page that is the currently used page. Process flow proceeds to operation 630.

In operation 630, each of the entries in a valid page are read. For example, the address identifier of each entry (e.g., starting from the first entry through the last entry written) is read and evaluated in operation 640 to determine whether the read address identifier matches a portion of an index (e.g., used to form address and locate a particular entry). When a valid match is determined, the program flow proceeds to operation 650. When a valid match is not determined, the program flow proceeds to terminal 699, where the current process flow finishes (and, for example, other processing is initiated or resumed).

In operation 650, the associated data in the volatile memory image is updated in accordance with the entry associated with the matching address identifier. Process flow proceeds to terminal 699, where the current process flow finishes (and, for example, other processing is initiated or resumed).

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A circuit, comprising:
a host interface operable to receive a first and second data word, the first and second data words each including at least one original symbol being associated with an address identifier for addressing the first and second data word;
a WOM (Write-Only Memory) controller operable to generate a first WOM-encoded word in response to the at least one original symbol of the first data word and to generate a second WOM-encoded word in response to the at least one original symbol of the second data word; and
an emulator operable to search entries of a first current page of a WOM device to locate a programmed WOM entry in a first location having a first field including the address identifier, to determine whether stored contents of a second field of the located entry are operable to be overwritten in accordance with the contents of the second WOM-encoded word, and if the stored contents of a second field of the located entry are operable to be overwritten, to store the contents of the second WOM-encoded word by overwriting the contents of the first WOM-encoded word in the first location, and if the stored contents of a second field of the located entry are not operable to be overwritten, to store the contents of the second WOM-encoded word by allocating a new entry and storing the second WOM-encoded word and the address identifier in the allocated new entry; and
wherein the determination of whether the stored contents of the second field of the located entry are operable to be overwritten is made in accordance with $P=[c_x(0) \cdot c_x(1)]+[c_x(0) \cdot c_x(2)]+[c_x(1) \cdot c_x(2)]$, where P=1 indicates the stored contents are operable to be overwritten, P=0 indicates the stored contents are not operable to be overwritten, and wherein:
$c_x(0)$ is a first encoded bit of the stored contents of the second field;
$c_x(1)$ is a second encoded bit of the stored contents of the second field; and
$c_x(2)$ is a first encoded bit of the stored contents of the second field.

2. The circuit of claim 1, wherein the emulator is operable to write contents of the first WOM-encoded word and the address identifier to the first location by changing a block-initialized state of selected bits in the first location of the located entry.

3. The circuit of claim 2, wherein the address identifier is not stored using a WOM encoding.

4. The circuit of claim 2, wherein the bits of the first location have a block-initialized state of being "1"s.

5. The circuit of claim 2, wherein the emulator is operable to determine whether the new entry is allocated in the first current page, and in response to the determination the new entry is not allocated in the first current page, to select a different page as a second current page.

6. The circuit of claim 5, wherein the contents of the second WOM-encoded word in the allocated new entry are stored in the second current page.

7. The circuit of claim 6, wherein data contents are copied to the second current page in accordance with contents of the entries stored in the first current page.

8. The circuit of claim 7, wherein the data contents copied to the second current page are copied from volatile memory having data contents stored in accordance with the contents of the entries stored in the first current page.

9. The circuit of claim 5, wherein the emulator is operable to determine whether the new entry is allocated in a first current region including the first location of the first current page, and in response to a determination the new entry is not allocated in the first current region, to select a different region as a second current region, wherein the search to locate the programmed WOM entry in the first location searches for the programmed WOM entry in the latest of the first and second current regions.

10. The circuit of claim 5, wherein the first current page is block-erased in response to the selection of the different page as the second current page.

11. A system, comprising:
a host processor operable to send a first and second data word, the first and second data words each including at least one original symbol being associated with an address identifier for addressing the first and second data word;
a WOM (Write-Only Memory) device communicatively coupled to the host processor and operable to be block-initialized in accordance with a block-initialized state;
a host interface operable to receive the first data word;
a WOM controller operable to generate a first WOM-encoded word in response to the original symbol of the first data word and to generate a second WOM-encoded word in response to the original symbol of the second data word; and
an emulator operable to search entries of a selected active page of a WOM device to locate a programmed WOM entry in a first location, to determine whether a second field of the located entry includes stored contents of the first WOM-encoded word operable to be overwritten to store the contents of the second WOM-encoded word, and when the first WOM-encoded word is operable to be overwritten, to store the contents of the second WOM-encoded word by overwriting the contents of the first WOM-encoded word, and when the first WOM-encoded word is not operable to be overwritten, to store the contents of the second WOM-encoded word by allocating a new entry and storing contents of the second WOM-encoded word in the allocated new entry;
wherein the emulator is operable to determine whether a second filed of the located entry includes stored contents of the first WOM-encoded word operable to be overwritten to store the contents of the second WOM-encoded word in accordance with $P=[c_x(0) \cdot c_x(1)]+[c_x(0) \cdot c_x(2)]+[c_x(1) \cdot c_x(2)]$, where P=1 indicates the stored contents are operable to be overwritten, P=0 indicates the stored contents are not operable to be overwritten, and wherein:
$c_x(0)$ is a first encoded bit of the stored contents of the second field;
$c_x(1)$ is a second encoded bit of the stored contents of the second field; and
$c_x(2)$ is a first encoded bit of the stored contents of the second field.

12. The system of claim 11, wherein the emulator is operable to write contents of the first WOM-encoded word and the address identifier to the first location by changing a block-initialized state of selected bits in the first location of the located entry.

13. The system of claim 12, wherein the original symbol of the first data word is at least two bits and is WOM-encoded and stored in the WOM device as at least three bits.

14. The system of claim 12, wherein the emulator is operable to determine whether a first current page including the first location is substantially full, and in response to the determination the current page is substantially full, to select a different page as a second current page, to copy a memory image associated with data stored in the first current page to the second current page, and to block-erase the first current page.

15. The system of claim 14, wherein the emulator is operable to determine whether a first current region including the first location is substantially full, and in response to the determination the current region is substantially full, to select a different region as a second current region such that a search to locate a WOM entry subsequently programmed in the second current region is started in accordance with the second current region.

16. A method, comprising:
receiving a first and second data word, the first and second data words each including at least one original symbol being associated with an address identifier;
generating a first WOM-encoded word in response to the original symbol of the first data word and generating a second WOM-encoded word in response to the original symbol of the second data word;
searching entries of a selected active page of a WOM device to locate a programmed WOM entry in a first location having a first field including the address identifier;
determining whether a second field of the located entry for including stored contents of the first WOM-encoded word is operable to be overwritten to store the contents of the second WOM-encoded word in accordance with $P=[c_x(0) \cdot c_x(1)]+[c_x(0) \cdot c_x(2)]+[c_x(1) \cdot c_x(2)]$, where P=1 indicates the stored contents are operable to be overwritten, P=0 indicates the stored contents are not operable to be overwritten, and wherein:
$c_x(0)$ is a first encoded bit of the stored contents of the second field;
$c_x(1)$ is a second encoded bit of the stored contents of the second field; and
$c_x(2)$ is a first encoded bit of the stored contents of the second field;
if the first WOM-encoded word is operable to be overwritten, storing the contents of the second WOM-encoded word by overwriting the contents of the first WOM-encoded word; and
if the first WOM-encoded word is not operable to be overwritten, storing the contents of the second WOM-encoded word by allocating a new entry and storing contents of the second WOM-encoded word in the allocated new entry.

17. The method of claim 16, comprising writing contents of the first WOM-encoded word and the address identifier to the first location by changing a block-initialized state of selected bits in the first location of the located entry.

18. The method of claim 17, comprising determining whether a first current page including the first location is substantially full, and in response to the determination the current page is substantially full, to select a different page as a second current page, to copy a memory image associated with data stored in the first current page to the second current page, and to block-erase the first current page.

19. The method of claim 16, comprising determining whether a first current region including the first location is substantially full, and in response to the determination the current region is substantially full, to select a different region as a second current region such that a search to locate a WOM entry subsequently programmed in the second current region is started in the second current region.

* * * * *